United States Patent
Akimoto et al.

(10) Patent No.: US 10,032,684 B2
(45) Date of Patent: Jul. 24, 2018

(54) LEAD BONDING STRUCTURE

(71) Applicant: Japan Aviation Electronics Industry, Ltd., Tokyo (JP)

(72) Inventors: Hiroshi Akimoto, Tokyo (JP); Takushi Yoshida, Tokyo (JP)

(73) Assignee: Japan Aviation Electronics Industry, Ltd., Tokyo (JP)

( * ) Notice: Subject to any disclaimer, the term of this patent is extended or adjusted under 35 U.S.C. 154(b) by 0 days.

(21) Appl. No.: 15/133,590

(22) Filed: Apr. 20, 2016

(65) Prior Publication Data

US 2016/0315031 A1    Oct. 27, 2016

(30) Foreign Application Priority Data

Apr. 24, 2015   (JP) ................................. 2015-089457

(51) Int. Cl.
*H01L 23/495* (2006.01)
*H01L 23/31* (2006.01)
*H01L 21/48* (2006.01)

(52) U.S. Cl.
CPC ...... *H01L 23/3114* (2013.01); *H01L 21/4828* (2013.01); *H01L 23/49541* (2013.01); *H01L 23/49555* (2013.01)

(58) Field of Classification Search
None
See application file for complete search history.

(56) References Cited

U.S. PATENT DOCUMENTS

| 4,920,074 A * | 4/1990 | Shimizu .............. H01L 21/4821 228/180.21 |
| 6,037,662 A * | 3/2000 | Yoon ................. H01L 23/49572 257/666 |
| 7,247,936 B2 * | 7/2007 | Son ................... H01L 23/49544 257/690 |
| 8,772,952 B2 | 7/2014 | Yasunaga et al. |
| 2005/0189627 A1 * | 9/2005 | Ito ....................... H01L 21/4825 257/666 |
| 2010/0187561 A1 * | 7/2010 | Tsou ................ H01L 23/49555 257/99 |

(Continued)

FOREIGN PATENT DOCUMENTS

JP   S63-015033 U   2/1988
JP   H02-213075 A   8/1990

(Continued)

OTHER PUBLICATIONS

Taiwanese Office Action dated Dec. 28, 2016, in connection with corresponding TW Application No. 105112263 (6 pgs., including English translation).

(Continued)

*Primary Examiner* — Abul Kalam
(74) *Attorney, Agent, or Firm* — Maier & Maier, PLLC

(57) ABSTRACT

A lead bonding structure includes: a plurality of leads extending outward from a package; and a plurality of electrode pads formed on a circuit board. The plurality of leads are soldered to the electrode pads, respectively. Each of the leads includes a lower wide portion having a width dimension greater than a width dimension of each of the electrode pads. The lower wide portion of each of the leads is soldered to the corresponding electrode pad.

7 Claims, 19 Drawing Sheets

(56) References Cited

U.S. PATENT DOCUMENTS

2014/0291824 A1* 10/2014 Sivaperumal ..... H01L 23/49541
257/676
2015/0180158 A1* 6/2015 Arai ................... H01R 13/5216
439/588
2016/0284632 A1* 9/2016 Shinohara ........... H01L 23/3121

FOREIGN PATENT DOCUMENTS

JP        H02-249258 A     10/1990
JP        2012-074600 A     4/2012

OTHER PUBLICATIONS

Korean Office Action dated Jul. 17, 2017, in connection with corresponding KR Application No. 10-2016-0047316 (8 pgs., including English translation).
Chinese Office Action dated Mar. 5, 2018, in connection with corresponding CN Application No. 201610246961.X (15 pgs., including English translation).

\* cited by examiner

LEAD BONDING STRUCTURE

INCORPORATION BY REFERENCE

This application is based upon and claims the benefit of priority from Japanese patent application No. 2015-089457, filed on Apr. 24, 2015, the disclosure of which is incorporated herein in its entirety by reference.

BACKGROUND OF THE INVENTION

1. Field of the Invention

The present invention relates to a lead bonding structure.

2. Description of Related Art

As a technique of this type, Japanese Unexamined Patent Application Publication No. H02-213075 discloses a method for bonding leads 103. According to the method, as shown in FIG. 19 of this application, a solder layer 102 is formed on each electrode 101 of a circuit board 100, and each of the leads 103 is brought into contact with the surface of the solder layer 102 and each of the leads 103 is heated by laser beams.

In the structure disclosed in Japanese Unexamined Patent Application Publication No. H02-213075, if the laser irradiation position deviates from the target irradiation position in the pitch direction, the solder layer 102 is directly irradiated with the laser beams, which may cause scattering of solder.

An object of the present invention is to provide a technique for suppressing scattering of solder when leads are soldered to respective electrode pads by laser beams.

SUMMARY OF THE INVENTION

An exemplary aspect of the present invention is a lead bonding structure including: a plurality of leads extending outward from a lead supporter; and a plurality of electrode pads formed on a board, the plurality of leads being respectively soldered to the plurality of electrode pads. Each of the leads includes a wide portion having a width dimension greater than a width dimension of each of the electrode pads. The wide portion of each of the leads is soldered to the corresponding electrode pad.

According to the present invention, it is possible to suppress scattering of solder when leads are soldered to respective electrode pads by laser.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE EXEMPLARY EMBODIMENTS (First Exemplary Embodiment)

A first exemplary embodiment will be described below with reference to FIGS. 1 to 7.

Figure 1:
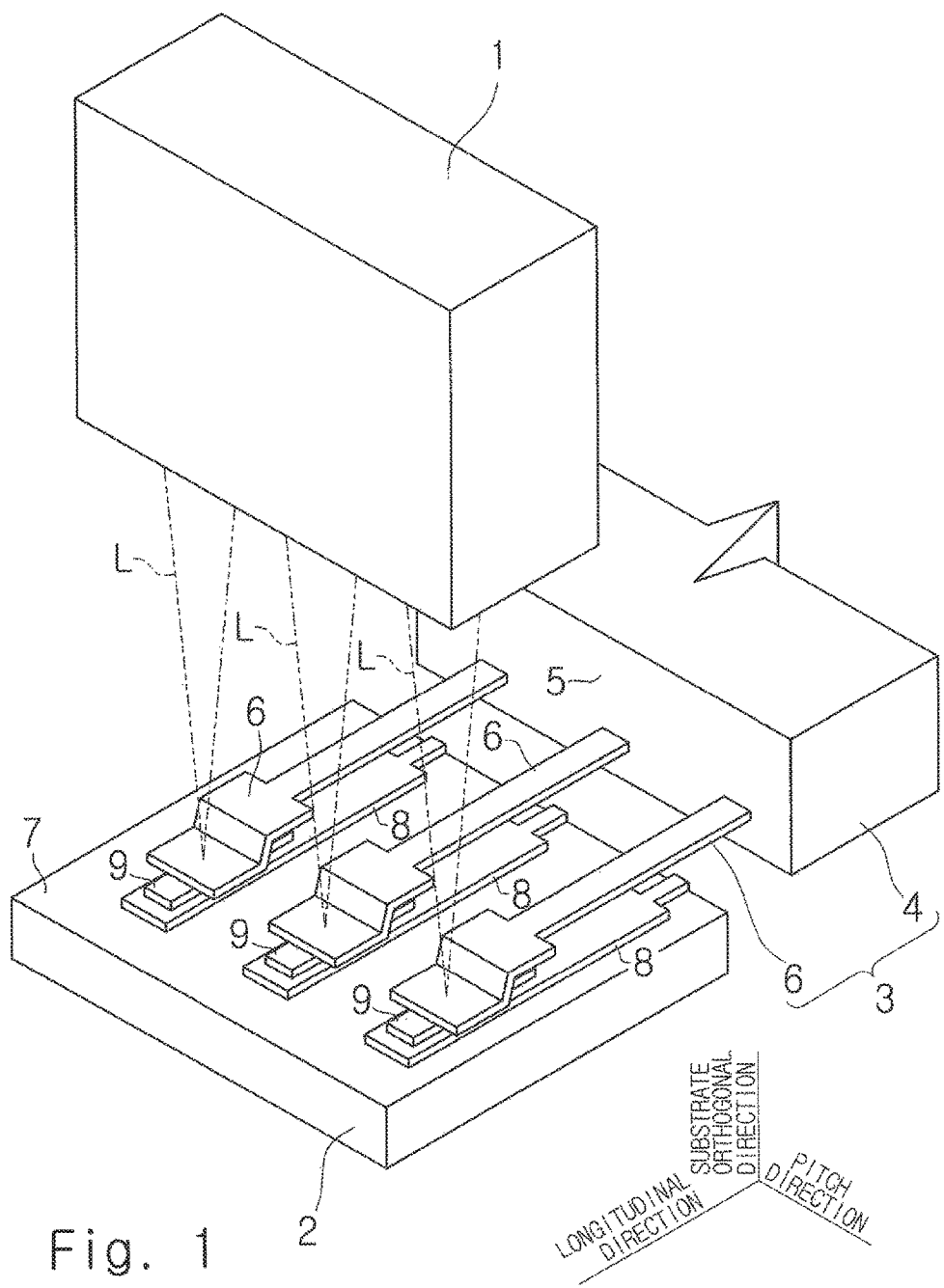
FIG. 1 is a perspective view showing a state before an electronic component is mounted on a circuit board by using a mounting device (first exemplary embodiment)

FIG. 1 shows a state where an electronic component 3 is mounted on a circuit board 2 by using a mounting device 1.

The electronic component 3 includes a package 4 (lead supporter) that protects a silicon chip, and a plurality of leads 6 extending outward from a side surface 5 (one side surface) of the package 4. The plurality of leads 6 extend substantially horizontally so that they are parallel to each other.

A plurality of electrode pads 8 are formed on a mounting surface 7 of the circuit board 2. The plurality of leads 6 of the electronic component 3 are respectively soldered to the plurality of electrode pads 8.

The mounting device 1 is a device that supplies solder 9 onto each electrode pad 8 and heats each lead 6 by irradiating each lead 6 with a laser beam L, thereby soldering the leads 6 to the respective electrode pads 8.

The terms "longitudinal direction", "pitch direction", and "board orthogonal direction" will now be defined. The longitudinal direction refers to the longitudinal direction of each lead 6. The pitch direction refers to a direction in which the plurality of leads 6 extending in parallel to each other are arranged. The board orthogonal direction refers to a direction orthogonal to the mounting surface 7 of the circuit board 2. The board orthogonal direction includes a board approaching direction and a board separating direction. The board approaching direction refers to a direction approaching the mounting surface 7 of the circuit board 2. The board separating direction refers to a direction away from the mounting surface 7 of the circuit board 2. The longitudinal direction, the pitch direction, and the board orthogonal direction are directions orthogonal to each other.

Figure 2:
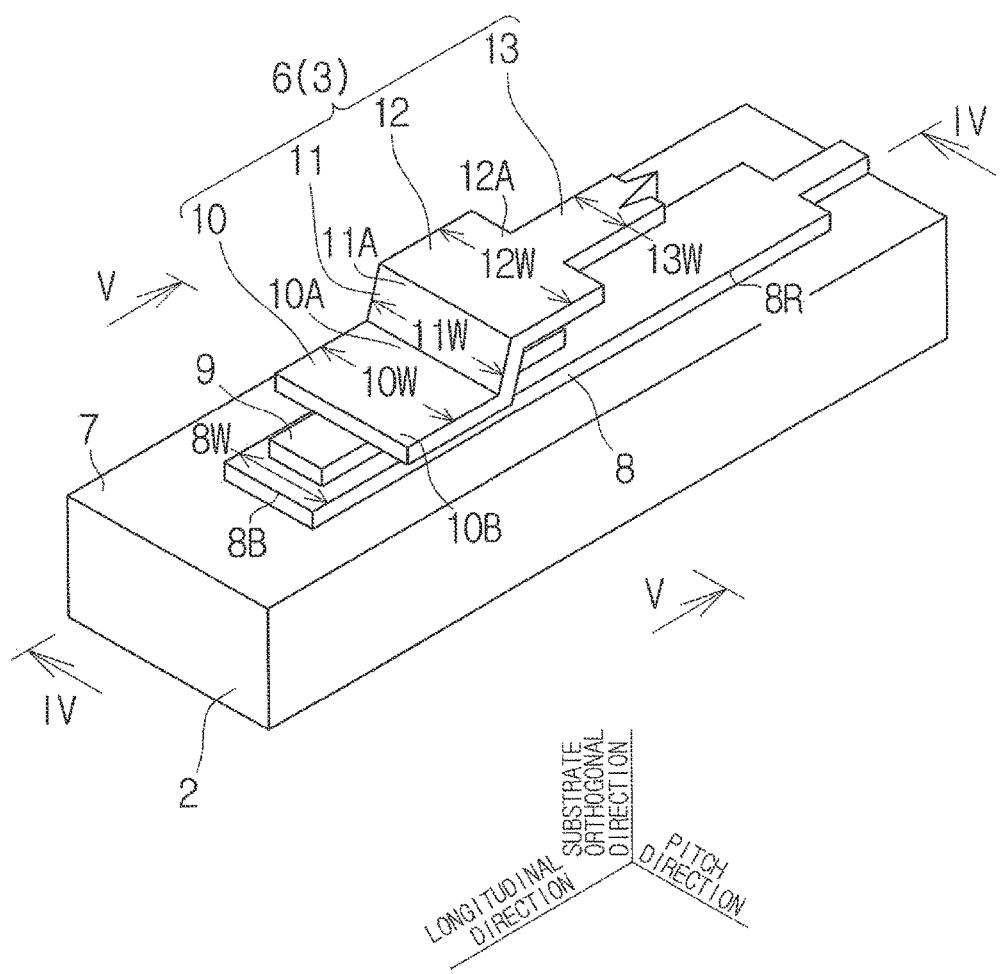
FIG. 2 is a partially perspective view showing the state before the electronic component is mounted on the circuit board (first exemplary embodiment)
Figure 3:
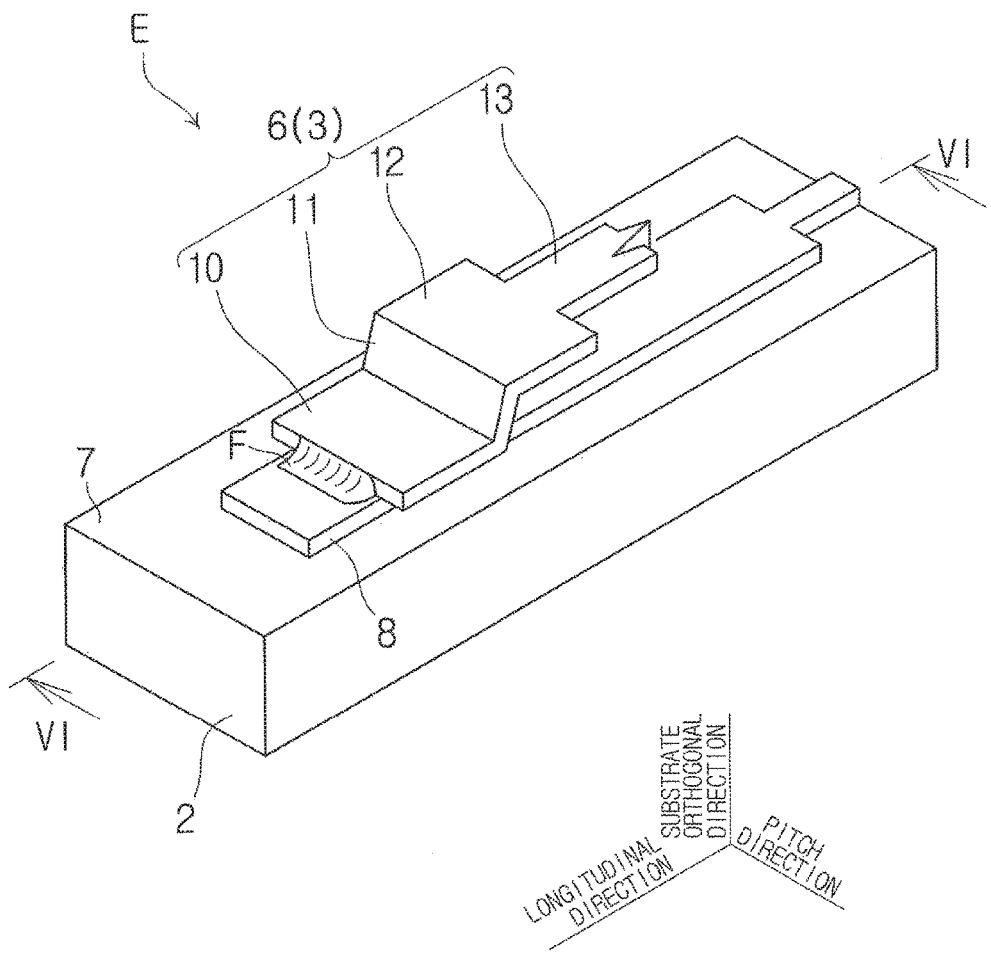
FIG. 3 is a partially perspective view showing a state after the electronic component is mounted on the circuit board (first exemplary embodiment)
Figure 4:
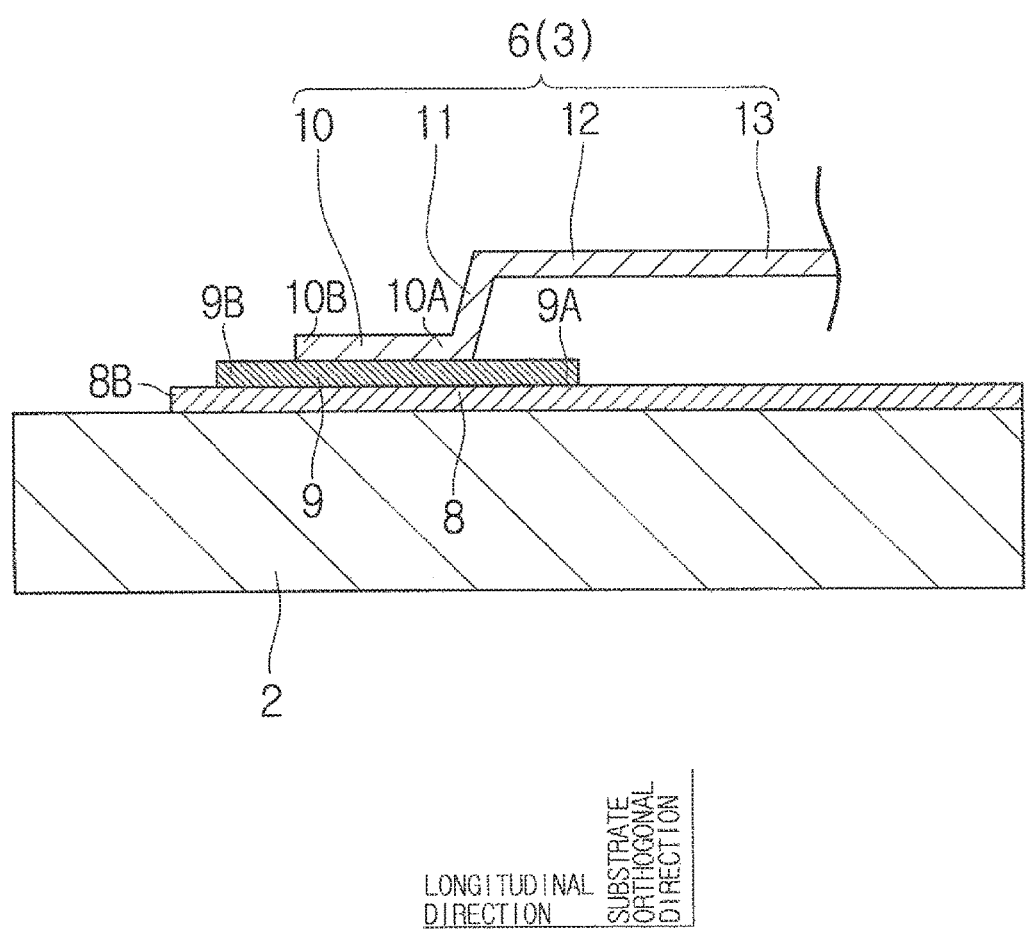
FIG. 4 is a sectional view taken along a line IV-IV of FIG. 2 (first exemplary embodiment)
Figure 5:
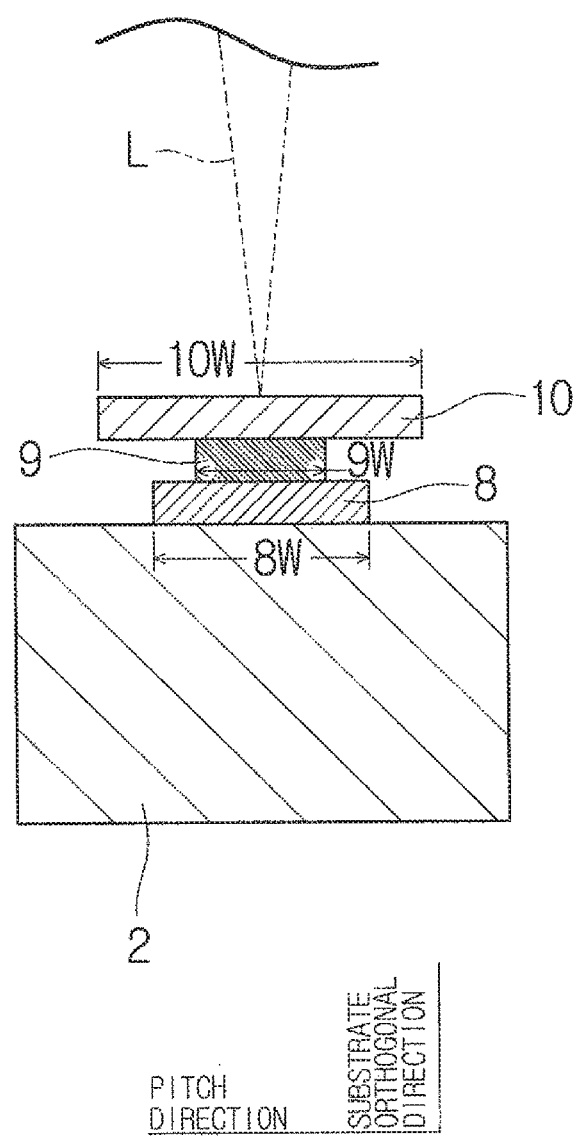
FIG. 5 is an end view taken along a line V-V of FIG. 2 (first exemplary embodiment)
Figure 6:
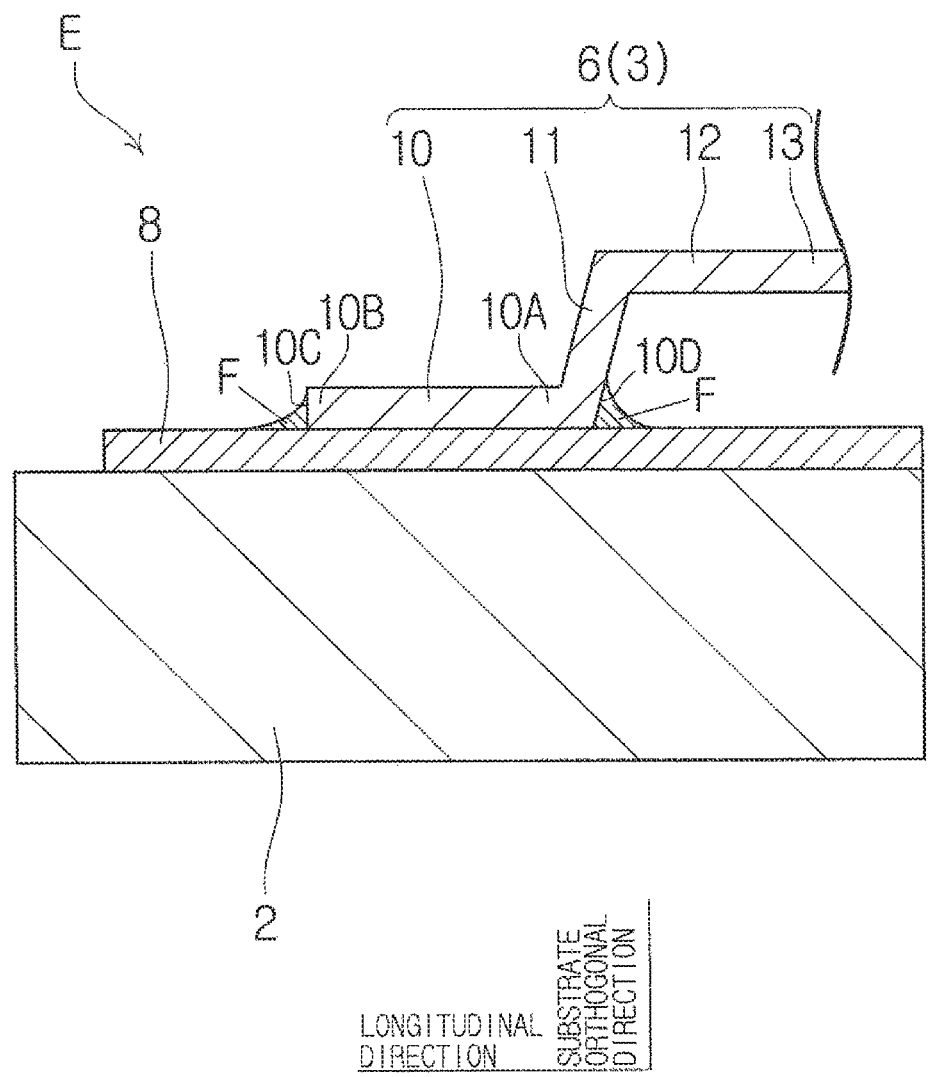
FIG. 6 is a sectional view taken along a line VI-VI of FIG. 3 (first exemplary embodiment)

FIG. 2 shows a state before the electronic component 3 is mounted on the circuit board 2. FIG. 3 shows a state after the electronic component 3 is mounted on the circuit board 2. FIG. 4 is a sectional view taken along a line IV-IV of FIG. 2. FIG. 5 is an end view taken along a line V-V of FIG. 2. FIG. 6 is a sectional view taken along a line VI-VI of FIG. 3.

As shown in FIGS. 2 to 6, each lead 6 includes a lower wide portion 10 (wide portion), a separating projecting portion 11, an upper wide portion 12, and a narrow portion 13. The lower wide portion 10, the separating projecting portion 11, the upper wide portion 12, and the narrow portion 13 are continuously formed in the stated order in the longitudinal direction.

The lower wide portion 10 is a portion that is irradiated with the laser beam L output from the mounting device 1, and is soldered to the corresponding electrode pad 8. As shown in FIG. 2, the thickness direction of the lower wide portion 10 is the same as the board orthogonal direction.

The separating projecting portion 11 is a portion that projects in the board separating direction from a rear end 10A of the lower wide portion 10. The rear end 10A is an end closer to the package 4. The separating projecting portion 11 is slightly inclined so as to approach the package 4 in a direction away from the mounting surface 7 of the circuit board 2.

The upper wide portion 12 is a portion that extends toward the package 4 from an upper end 11A of the separating projecting portion 11. The upper end 11A is an end of the separating projecting portion 11 in the board separating direction. The upper end 11A is an end farther from the mounting surface 7 of the circuit board 2. The thickness direction of the upper wide portion 12 is the same as the board orthogonal direction.

The narrow portion 13 is a portion that extends toward the package 4 from a rear end 12A of the upper wide portion 12. The rear end 12A is an end closer to the package 4. The thickness direction of the narrow portion 13 is the same as the board orthogonal direction.

The lower wide portion 10 has a width dimension 10W which is a dimension in the pitch direction. Similarly, the separating projecting portion 11 has a width dimension 11W which is a dimension in the pitch direction. The upper wide portion 12 has a width dimension 12W which is a dimension in the pitch direction. The narrow portion 13 has a width dimension 13W which is a dimension in the pitch direction. In the first exemplary embodiment, the width dimension 10W, the width dimension 11W, and the width dimension 12W are equal to each other and are greater than the width dimension 13W.

Each electrode pad 8 is formed on the mounting surface 7 of the circuit board 2 in such a manner that the electrode pad 8 is elongated along the longitudinal direction of the corresponding lead 6. Each electrode pad 8 has a width dimension 8W which is a dimension in the pitch direction.

As shown in FIGS. 2 and 5, the width dimension 8W of each electrode pad 8 is smaller than the width dimension 10W of the lower wide portion 10. Accordingly, each lower wide portion 10 can cover the entire pitch-direction area of the corresponding electrode pad 8. Specifically, when the electrode pads 8 and the lower wide portions 10 are centered in the pitch direction, each lower wide portion 10 covers the entire pitch-direction area of the corresponding electrode pad 8. More specifically, when the electrode pads 8 and the lower wide portions 10 are centered in the pitch direction, each lower wide portion 10 covers the entire pitch-direction area of the corresponding electrode pad 8 in a part of the area thereof in the longitudinal direction.

Referring to FIG. 2 again, a leading end 10B of the lower wide portion 10 of each lead 6 is closer to the package 4 than the leading end 8B of each electrode pad 8. The leading end 10B is an end farther from the package 4. The leading end 8B is an end farther from the package 4. Accordingly, the leading end 8B of each electrode pad 8 is not covered with the corresponding lead 6, but is upwardly exposed.

An appropriate amount of the solder 9 is supplied onto each electrode pad 8 by the mounting device 1. The solder 9 is generally supplied to an area within an outline 8R of each electrode pad 8. Accordingly, as shown in FIG. 5, a width dimension 9W which is a dimension of the solder 9 in the pitch direction is smaller than the width dimension 8W of each electrode pad 8, or is equal to the width dimension 8W of each electrode pad 8. Thus, the lower wide portion 10 of each lead 6 can cover the entire pitch-direction area of the solder 9. Specifically, when the electrode pads 8 and the lower wide portions 10 of the leads 6 are centered in the pitch direction, the lower wide portion 10 of each lead 6 covers the entire pitch-direction area of the solder 9. As shown in FIG. 4, the mounting device 1 supplies the solder 9 to a location where a leading end 9B of the solder 9 is farther from the package 4 than the leading end 10B of the lower wide portion 10 of each lead 6 and a rear end 9A of the solder 9 is closer to the package 4 than the rear end 10A of the lower wide portion 10. The leading end 9B is an end farther from the package 4. The rear end 9A is an end closer to the package 4.

In the structure described above, when the lower wide portion 10 of each lead 6 shown in FIG. 2 is irradiated with the laser beam L and the lower wide portion 10 is heated, the solder 9 provided on each electrode pad 8 is melted and solidified, so that the lower wide portion 10 of each lead 6 is soldered to the corresponding electrode pad 8 as shown in FIGS. 3 and 6. Specifically, a solder fillet F which is elongated in the pitch direction is formed between each electrode pad 8 and a leading end surface 10C of the leading end 10B of the lower wide portion 10 of each lead 6. Similarly, another solder fillet F which is elongated in the pitch direction is formed between each electrode pad 8 and a rear end surface 10D of the rear end 10A of the lower wide portion 10 of each lead 6.

As shown in FIGS. 3 and 6, a lead bonding structure E includes the plurality of leads 6 extending outward from the package 4, and the plurality of electrode pads 8 which are formed on the circuit board 2. The plurality of leads 6 are soldered to the plurality of electrode pads 8, respectively.

The first exemplary embodiment of the present invention described above has the following features.

As shown in FIGS. 1 to 6, the lead bonding structure E includes: the plurality of leads 6 extending outward from the package 4 (lead supporter); and the plurality of electrode pads 8 which are formed on a circuit board 2 (board). The plurality of leads 6 are soldered to the plurality of electrode pads 8, respectively. Each lead 6 includes the lower wide portion 10 (wide portion) having the width dimension 10W greater than the width dimension 8W of each electrode pad 8. The lower wide portion 10 of each lead 6 is soldered to the corresponding electrode pad 8. According to the above structure, when each lead 6 is soldered to the corresponding electrode pad 8, the entire pitch-direction area of the solder 9 provided on each electrode pad 8 can be covered with the lower wide portion 10 of the corresponding lead 6. Accordingly, when the lower wide portion 10 of each lead 6 is irradiated with the laser beam L so that each lead 6 is soldered to the corresponding electrode pad 8, the laser beam L is prevented from being directly irradiated onto the solder 9 even if the irradiation position of the laser beam L slightly deviates from the target irradiation position in the pitch direction. Thus, scattering of the solder 9 can be suppressed.

Further, the entire pitch-direction area of the solder 9 can be covered with the lower wide portion 10 of each lead 6. Accordingly, even if the solder 9 or flux is scattered, the range of scattering of the solder 9 or flux is extremely narrow.

Furthermore, the entire pitch-direction area of each electrode pad 8 can be covered with the lower wide portion 10 of the corresponding lead 6. Accordingly, even if the irradiation position of the laser beam L slightly deviates from the target irradiation position in the pitch direction, the laser beam L is prevented from being directly irradiated onto each electrode pad 8. This makes it possible to suppress peeling of each electrode pad 8 from the circuit board 2 due to heat deformation of each electrode pad 8.

According to a common-sense design concept, the width dimension 10W of the lower wide portion 10 of each lead 6 is set to be smaller than the wide dimension 8W of each electrode pad 8 so that the solder fillet formed between each lead 6 and each electrode pad 8 can be observed from above to confirm whether each lead 6 is reliably soldered to the corresponding electrode pad 8. On the other hand, in the first exemplary embodiment described above, the width dimension 10W of the lower wide portion 10 of each lead 6 is set to be greater than the width dimension 8W of each electrode pad 8. Although this contradicts the above-mentioned common-sense design concept, it is intended to give priority to the suppression of scattering of the solder 9.

According to another common-sense design concept, the width dimension 10W of the lower wide portion 10 of each lead 6 is set to be smaller than the width dimension 8W of each electrode pad 8. This design concept is essential for arranging the plurality of leads 6 at a fine pitch. On the other hand, in the first exemplary embodiment described above, the width dimension 10W of the lower wide portion 10 of each lead 6 is set to be greater than the width dimension 8W of each electrode pad 8. Although this contradicts the above-mentioned common-sense design concept, it is intended to give priority to the suppression of scattering of the solder 9.

Figure 7:
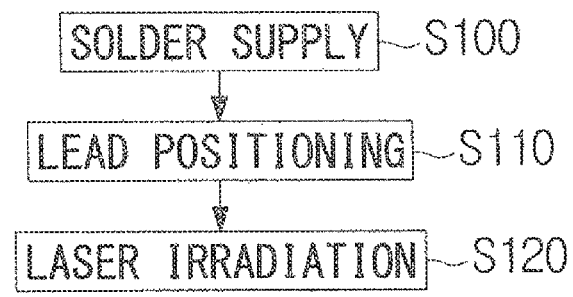
FIG. 7 is a flowchart showing a lead bonding method (first exemplary embodiment)

As shown in FIG. 7, a lead bonding method includes: the step (S100) of supplying the solder 9 to each electrode pad 8; the step (S110) of positioning each lead 6 with respect to the corresponding electrode pad 8; and the step (S120) of irradiating the lower wide portion 10 of each lead 6 with the laser beam L, to thereby solder the lower wide portion 10 of each lead 6 to the corresponding electrode pad 8. In the step (S120) of irradiating the lower wide portion 10 of each lead 6 with the laser beam L, the entire pitch-direction area of the solder 9 is covered with the lower wide portion 10 of each lead 6. According to the above method, when the lower wide portion 10 of each lead 6 is irradiated with the laser beam L to thereby solder each lead 6 to the corresponding electrode pad 8, the laser beam L is prevented from being directly irradiated onto the solder 9 even if the irradiation position of the laser beam L slightly deviates from the target irradiation position in the pitch direction. Thus, scattering of the solder 9 can be suppressed.

Prior to soldering of the lower wide portion 10 of each lead 6 to the corresponding electrode pad 8, the solder 9 supplied onto each electrode pad 8 may be temporarily melted so that the solder 9 can be uniformly applied onto each electrode pad 8.

The electrode pads 8 generally have excellent wettability with solder. Accordingly, if a question arises in the determination of the width dimension 8W of each electrode pad 8, the width dimension 8W of each electrode pad 8 should be determined by taking into consideration whether the wettability with the solder is excellent or not.

(Second Exemplary Embodiment)

Next, a second exemplary embodiment will be described with reference to FIGS. 8 and 9. Differences between the second exemplary embodiment and the first exemplary embodiment will be mainly described, while a repeat of previous descriptions is omitted.

In the first exemplary embodiment described above, as shown in FIG. 2, the leading end 10B of the lower wide portion 10 of each lead 6 is closer to the package 4 than the leading end 8B of the corresponding electrode pad 8. Accordingly, the leading end 8B of each electrode pad 8 is not covered with the corresponding lead 6, but is upwardly exposed. On the other hand, in the second exemplary embodiment, as shown in FIGS. 8 and 9, the leading end 10B of the lower wide portion 10 of each lead 6 is farther from the package 4 than the leading end 8B of the corresponding electrode pad 8. Thus, the entire pitch-direction area of the leading end 8B of each electrode pad 8 is covered with the lower wide portion 10 of the corresponding lead 6.

Figure 8:
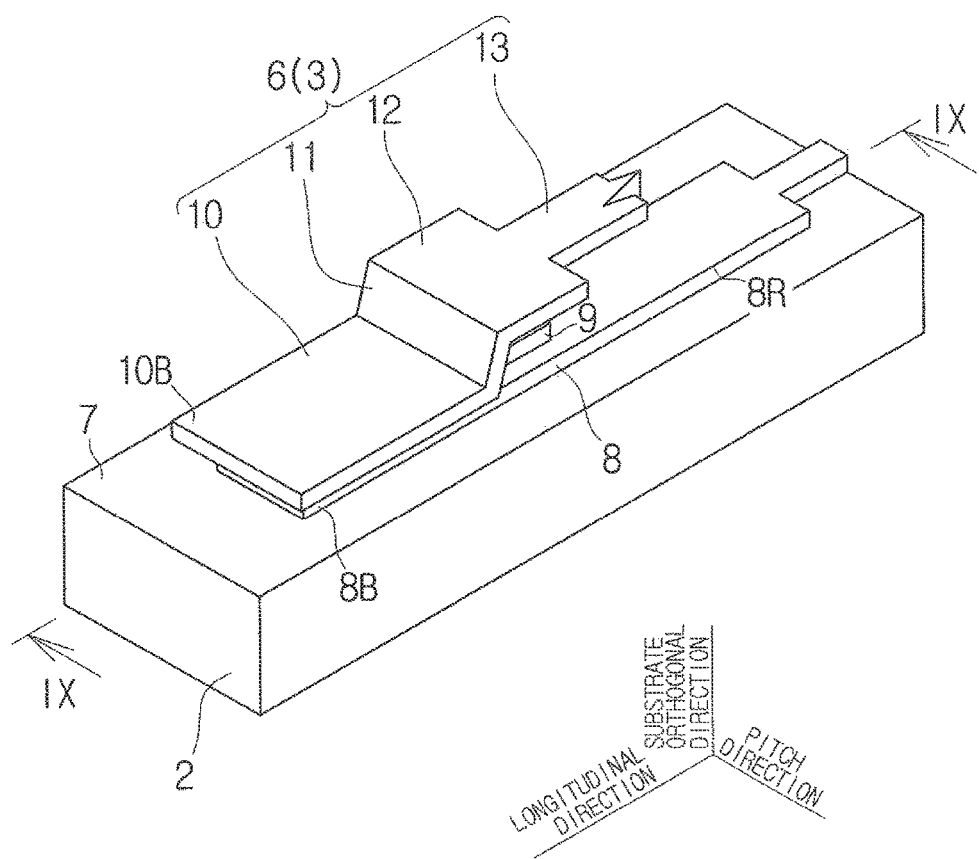
FIG. 8 is a partially perspective view showing a state before the electronic component is mounted on the circuit board (second exemplary embodiment)
Figure 9:
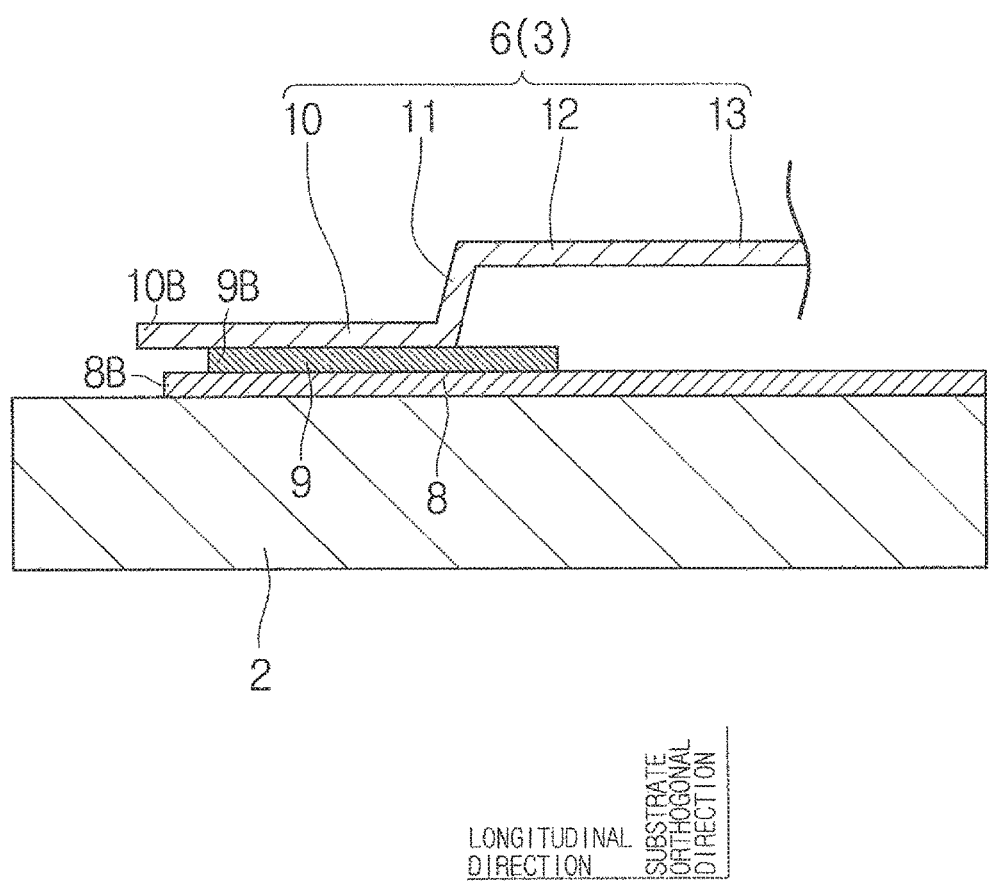
FIG. 9 is a sectional view taken along a line IX-IX of FIG. 8 (second exemplary embodiment)

As shown in FIG. 8, the solder 9 is generally supplied to an area within the outline 8R of each electrode pad 8. Accordingly, as shown in FIG. 9, the solder 9 is supplied to a location where the leading end 9B of the solder 9 is closer to the package 4 than the leading end 10B of the lower wide portion 10 of each lead 6. Thus, the entire pitch-direction area of the leading end 9B of the solder 9 is covered with the lower wide portion 10 of the corresponding lead 6.

The second exemplary embodiment described above has the following features.

The leading end 10B of the lower wide portion 10 of each lead 6 is farther from the package 4 than the leading end 8B of the corresponding electrode pad 8. According to the above structure, when each lead 6 is soldered to the corresponding electrode pad 8, the entire pitch-direction area of the leading end 9B of the solder 9 provided on each electrode pad 8 can be covered with the lower wide portion 10 of the corresponding lead 6. Accordingly, when the lower wide portion 10 of each lead 6 is irradiated with the laser beam L to thereby solder each lead 6 to the corresponding electrode pad 8, the laser beam L is prevented from being directly irradiated onto the solder 9 even if the irradiation position of the laser beam L slightly deviates from the target irradiation position in the longitudinal direction. Thus, scattering of the solder 9 can be suppressed.

(Third Exemplary Embodiment)

Figure 10:
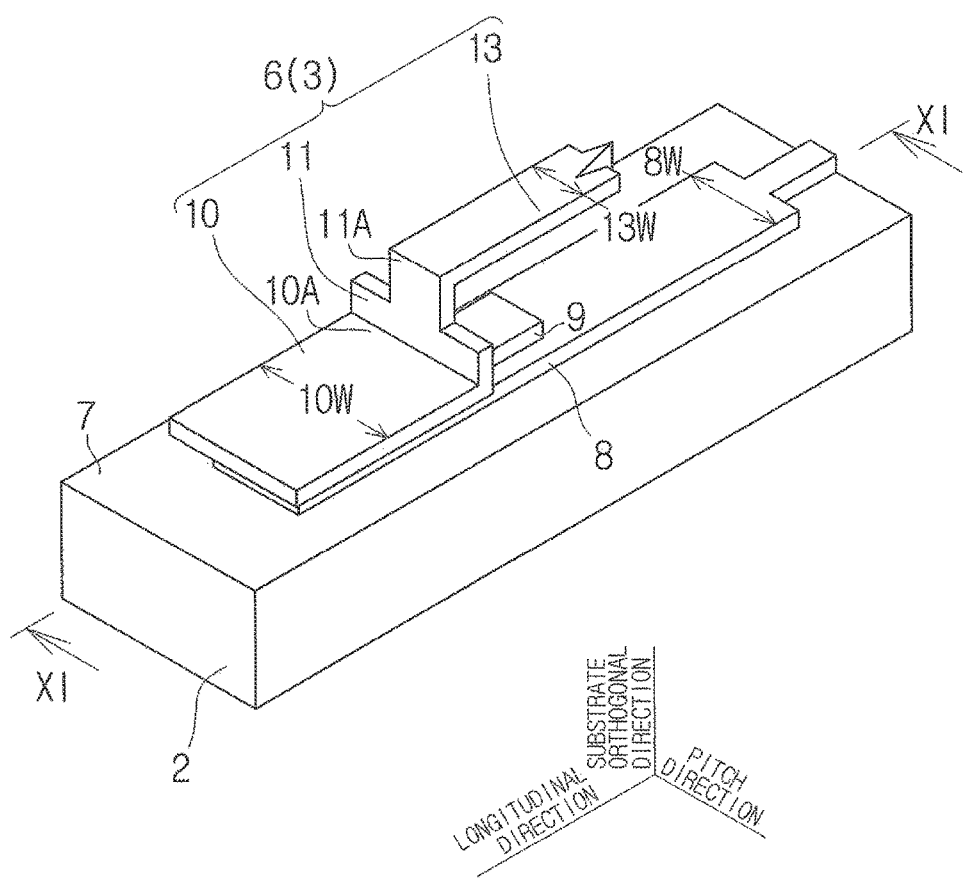
FIG. 10 is a partially perspective view showing a state before the electronic component is mounted on the circuit board (third exemplary embodiment)
Figure 11:
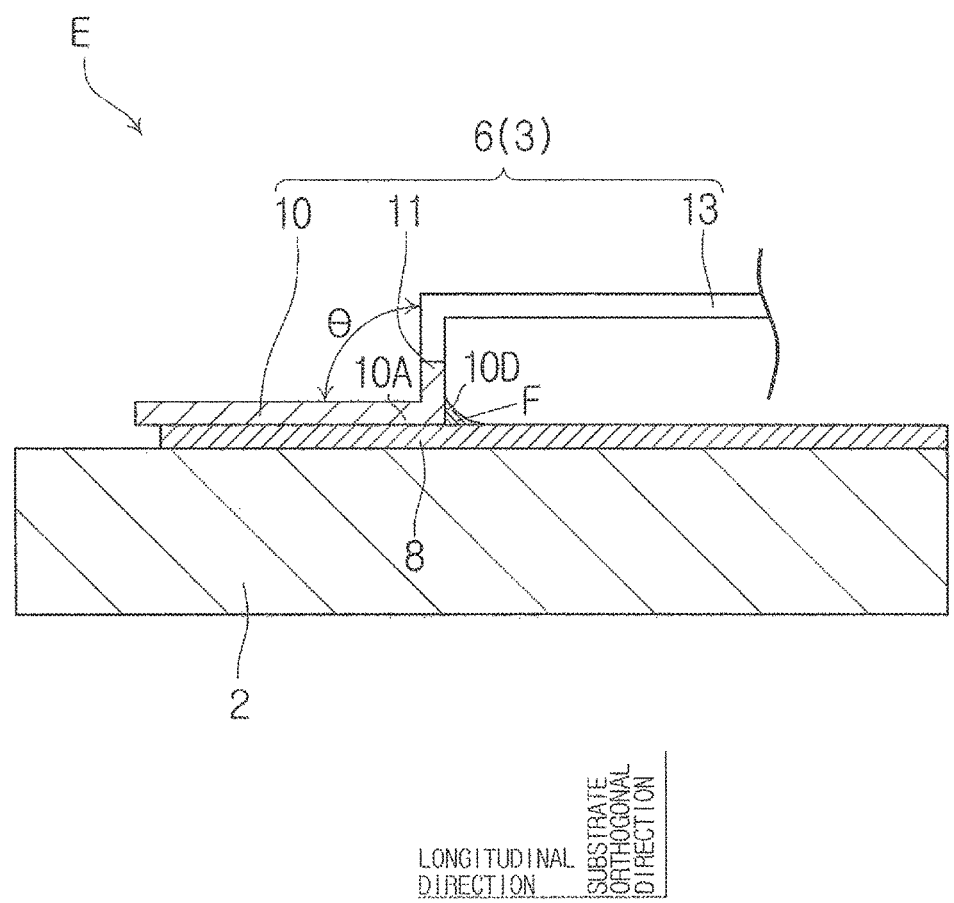
FIG. 11 is a sectional view taken along a line XI-XI of FIG. 10 (third exemplary embodiment)

Next, a third exemplary embodiment will be described with reference to FIGS. 10 and 11. Differences between the third exemplary embodiment and the second exemplary embodiment will be mainly described, while a repeat of previous descriptions is omitted.

In the second exemplary embodiment described above, as shown in FIG. 8, each lead 6 includes the lower wide portion 10, the separating projecting portion 11, the upper wide portion 12, and the narrow portion 13. However, in the third exemplary embodiment, as shown in FIGS. 10 and 11, each lead 6 includes the lower wide portion 10, the separating projecting portion 11, and the narrow portion 13, and does not include the upper wide portion 12. The lower wide portion 10, the separating projecting portion 11, and the narrow portion 13 are continuously formed in the stated order in the longitudinal direction.

The lower wide portion 10 is a portion that is irradiated with the laser beam L output from the mounting device 1 and is soldered to the corresponding electrode pad 8. The thickness direction of the lower wide portion 10 is the same as the board orthogonal direction.

The separating projecting portion 11 is a portion that projects in the board separating direction from the rear end 10A of the lower wide portion 10. The rear end 10A is an end closer to the package 4. The thickness direction of the separating projecting portion 11 is substantially perpendicular to the thickness direction of the lower wide portion 10. As shown in FIG. 11, an angle θ formed between the lower wide portion 10 and the separating projecting portion 11 is 90 degrees.

Referring to FIG. 10 again, the narrow portion 13 is a portion that extends toward the package 4 from the upper end 11A of the separating projecting portion 11. The upper end 11A is an end in the board separating direction of the separating projecting portion 11. The upper end 11A is an end farther from the mounting surface 7 of the circuit board 2. The thickness direction of the narrow portion 13 is the same as the board orthogonal direction.

In the third exemplary embodiment, the width dimension 10W is greater than the width dimension 8W. The width dimension 8W is greater than the width dimension 13W. Accordingly, the lower wide portion 10 of each lead 6 can cover the entire pitch-direction area of the corresponding electrode pad 8. Specifically, when the electrode pads 8 and the lower wide portions 10 are centered in the pitch direction, the lower wide portion 10 of each lead 6 covers the entire pitch-direction area of the corresponding electrode pad 8. On the other hand, the narrow portion 13 of each lead 6 cannot cover the entire pitch-direction area of each electrode pad 8. Accordingly, as shown in FIG. 11, the solder fillet F which is elongated in the pitch direction and is formed between each electrode pad 8 and the rear end surface 10D of the rear end 10A of the lower wide portion 10 of each lead 6 can be checked from above.

The third exemplary embodiment described above has the following features.

Each lead 6 further includes: the separating protruding portion 11 which projects from the rear end 10A of the lower wide portion 10 in a direction away from the mounting surface 7 of the circuit board 2; and the narrow portion 13 which extends toward the package 4 from the upper end 11A of the separating projecting portion 11 and has the width dimension 13W which is smaller than the width dimension 8W of each electrode pad 8. According to the above structure, the solder fillet F, which is formed between each electrode pad 8 and the rear end surface 10D of the lower wide portion 10 of each lead 6, can be checked from above.

(Fourth Exemplary Embodiment)

Figure 12:
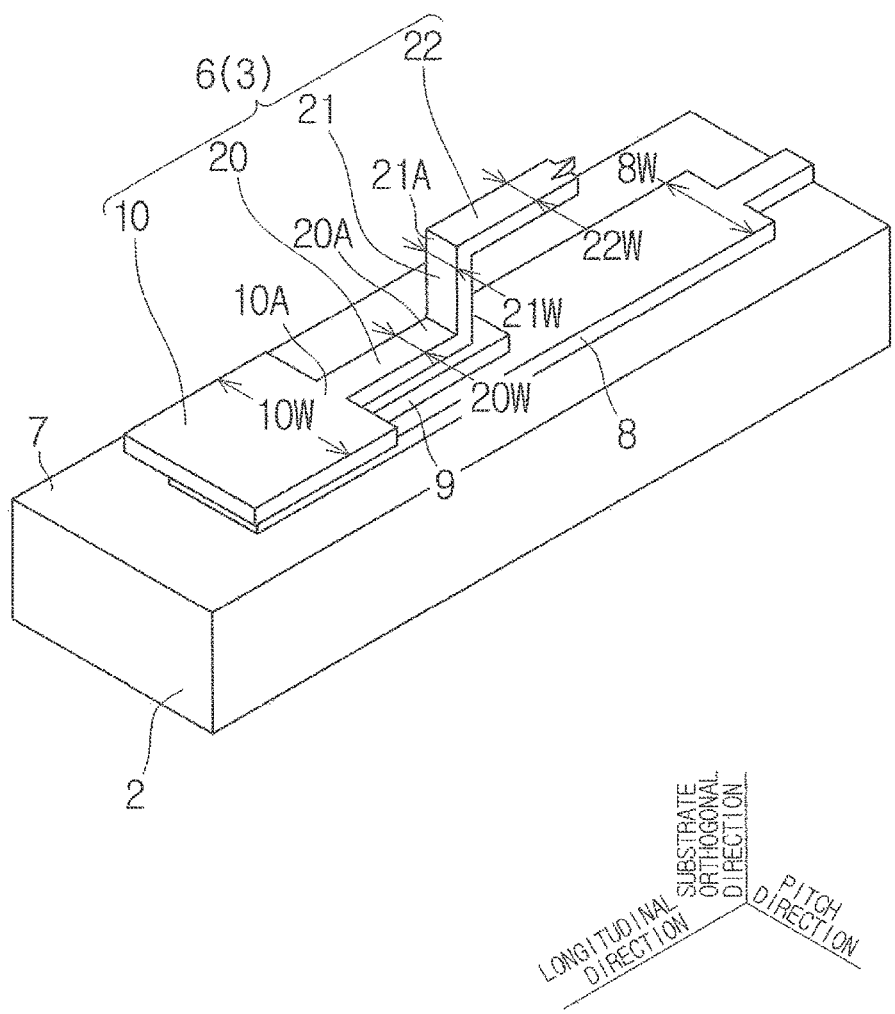
FIG. 12 is a partially perspective view showing a state before the electronic component is mounted on the circuit board (fourth exemplary embodiment)
Figure 13:
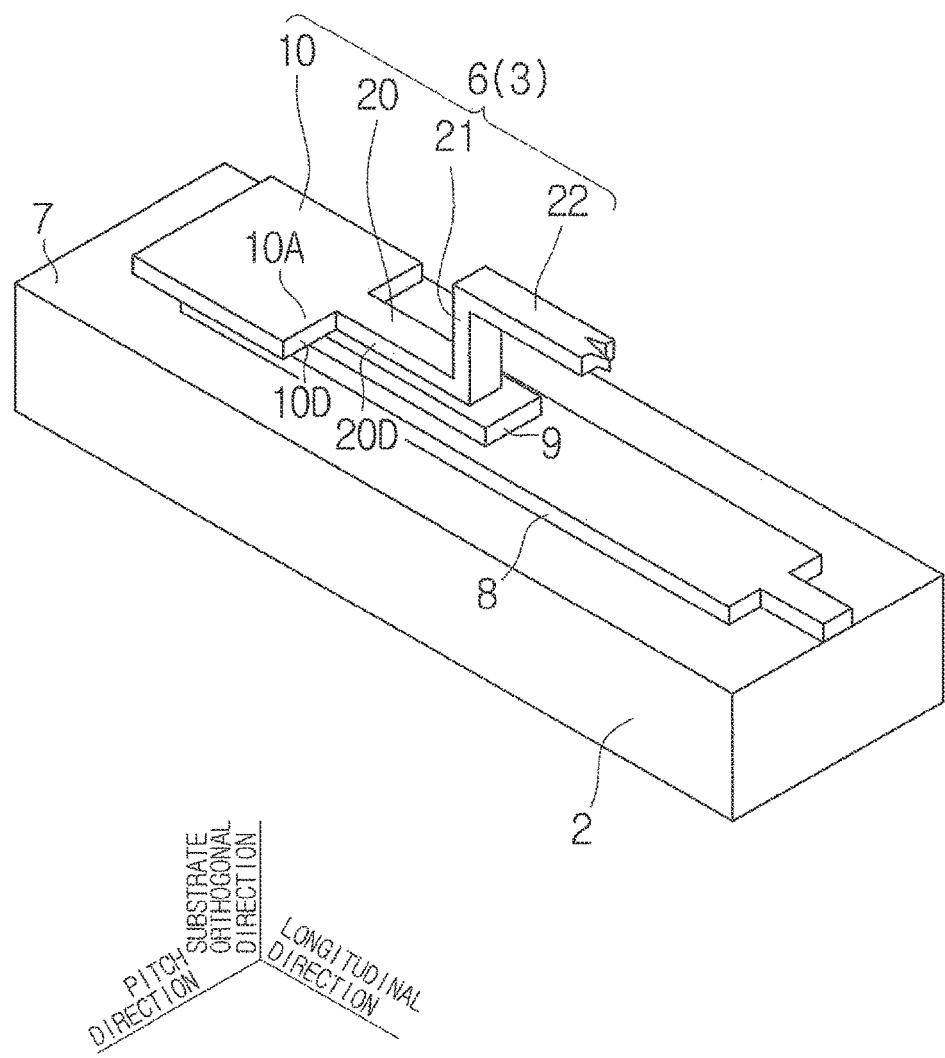
FIG. 13 is a partially perspective view showing a state before the electronic component is mounted on the circuit board when viewed from another angle (fourth exemplary embodiment)

Next, a fourth exemplary embodiment will be described with reference to FIGS. 12 to 14. Differences between the fourth exemplary embodiment and the second exemplary embodiment will be mainly described, while a repeat of previous descriptions is omitted.

In the second exemplary embodiment described above, as shown in FIG. 8, each lead 6 includes the lower wide portion 10, the separating projecting portion 11, the upper wide portion 12, and the narrow portion 13. However, in the fourth exemplary embodiment, as shown in FIGS. 12 and 13, each lead 6 includes the lower wide portion 10, a lower narrow portion 20 (narrow portion), a separating projecting portion 21, and an upper narrow portion 22. The lower wide portion 10, the lower narrow portion 20, the separating projecting portion 21, and the upper narrow portion 22 are continuously formed in the stated order in the longitudinal direction.

The lower wide portion 10 is a portion that is irradiated with the laser beam L output from the mounting device 1 and is soldered to the corresponding electrode pad 8. As shown in FIG. 12, the thickness direction of the lower wide portion 10 is the same as the board orthogonal direction.

Similarly to the lower wide portion 10, the lower narrow portion 20 is a portion that is soldered to the corresponding electrode pad 8 and extends toward the package 4 from the rear end 10A of the lower wide portion 10. The rear end 10A is an end closer to the package 4. The thickness direction of the lower narrow portion 20 is the same as the board orthogonal direction.

The separating projecting portion 21 is a portion that projects in the board separating direction from a rear end 20A of the lower narrow portion 20. The rear end 20A is an end closer to the package 4. The thickness direction of the separating projecting portion 21 is substantially orthogonal to the thickness direction of the lower narrow portion 20. Note that in the fourth exemplary embodiment, the separating projecting portion 21 may be slightly inclined so as to approach the package 4 in a direction away from the mounting surface 7 of the circuit board 2.

The upper narrow portion 22 is a portion that extends toward the package 4 from an upper end 21A of the separating projecting portion 21. The upper end 21A is an end in the board separating direction of the separating projecting portion 21. The upper end 21A is an end farther from the mounting surface 7 of the circuit board 2. The thickness direction of the upper narrow portion 22 is the same as the board orthogonal direction.

The lower wide portion 10 has the width dimension 10W which is a dimension in the pitch direction. Similarly, the lower narrow portion 20 has a width dimension 20W which is a dimension in the pitch direction. The separating projecting portion 21 has a width dimension 21W which is a dimension in the pitch direction. The upper narrow portion 22 has a width dimension 22W which is a dimension in the pitch direction. In the fourth exemplary embodiment, the width dimension 20W, the width dimension 21W, and the width dimension 22W are equal to each other and are smaller than the width dimension 10W.

Each electrode pad 8 is formed on the mounting surface 7 of the circuit board 2 in such a manner that the electrode pad 8 is elongated along the longitudinal direction of the corresponding lead 6. Each electrode pad 8 has the width dimension 8W which is a dimension in the pitch direction. The width dimension 8W of each electrode pad 8 is greater than the width dimension 20W of the lower narrow portion 20.

Figure 14:
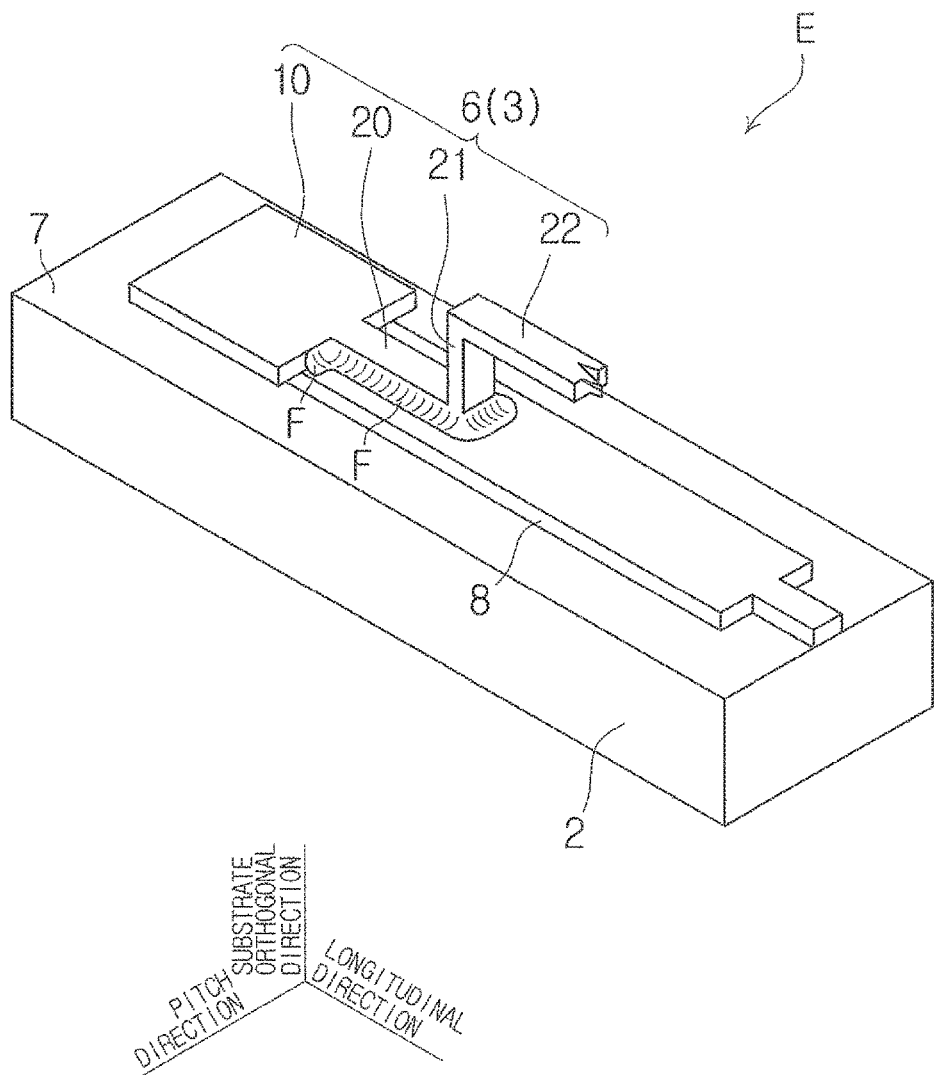
FIG. 14 is a partially perspective view showing a state after the electronic component is mounted on the circuit board (fourth exemplary embodiment)

In the structure described above, when the lower wide portion 10 of each lead 6 is irradiated with the laser beam L and the lower wide portion 10 is heated, the solder 9 provided on each electrode pad 8 is melted and solidified, so that the lower wide portion 10 and the lower narrow portion 20 of each lead 6 are soldered to the corresponding electrode pad 8 as shown in FIG. 14. Specifically, as shown in FIGS. 13 and 14, the solder fillet F is formed between each electrode pad 8 and the rear end surface 10D of the rear end 10A of the lower wide portion 10 of each lead 6. Similarly, the solder fillet F which is elongated in the longitudinal direction is formed between each electrode pad 8 and a side edge face 20D of the lower narrow portion 20. The solder fillet F formed between each electrode pad 8 and the side edge face 20D of the lower narrow portion 20 can be checked from above.

The fourth exemplary embodiment of the present invention described above has the following features.

Each lead 6 further includes the lower narrow portion 20 (narrow portion) having the width dimension 20W smaller than the width dimension 8W of each electrode pad 8. The lower narrow portion 20 of each lead 6 is also soldered to the corresponding electrode pad 8. According to the above structure, the solder fillet F formed between each electrode pad 8 and the lower narrow portion 20 of each lead 6 can be checked from above.

(Fifth Exemplary Embodiment)

Figure 15:
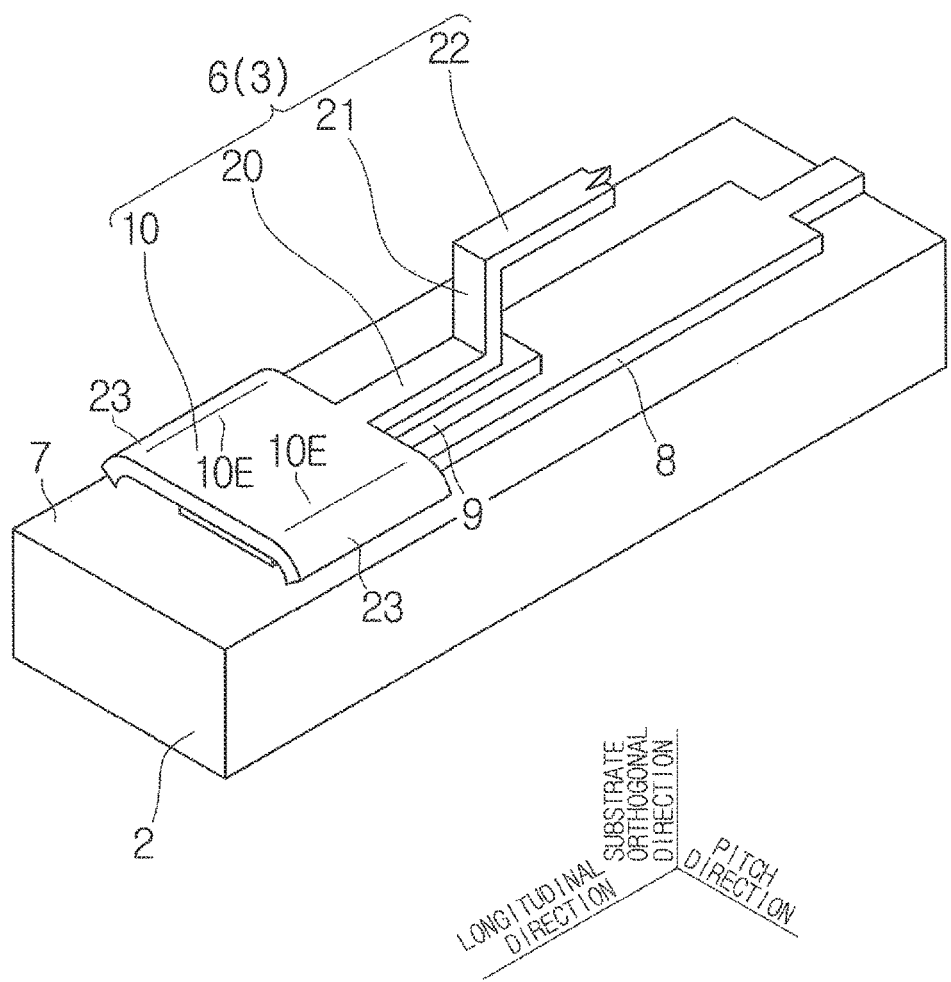
FIG. 15 is a partially perspective view showing a state before the electronic component is mounted on the circuit board (fifth exemplary embodiment)

A fifth exemplary embodiment will be described below with reference to FIG. 15. Differences between the fifth exemplary embodiment and the fourth exemplary embodiment will be mainly described, while a repeat of previous descriptions is omitted.

The lower wide portion 10 of each lead 6 has a flat plate shape and includes two side edges 10E. The two side edges 10E are ends of the lower wide portion 10 in the pitch direction. Further, each lead 6 includes two side edge inclined portions 23 (inclined portions) that respectively project from the two side edges 10E of the lower wide portion 10 and are inclined with a slight curve so as to approach the mounting surface 7 of the circuit board 2.

That is, the fifth exemplary embodiment has the following features.

Each lead 6 further includes the two side edge inclined portions 23 (inclined portions) that project from the lower wide portion 10 and are inclined so as to approach the circuit board 2. According to the above structure, scattering of the solder 9 can be more effectively suppressed.

Each lead 6 further includes the two side edge inclined portions 23 that respectively project from the two side edges 10E (both side edges) of the lower wide portion 10 and are inclined so as to approach the circuit board 2. According to the above structure, scattering of the solder 9 can be more effectively suppressed.

While each lead 6 includes the two side edge inclined portions 23 in the above example, each lead 6 may include only one side edge inclined portion 23.

(Sixth Exemplary Embodiment)

Figure 16:
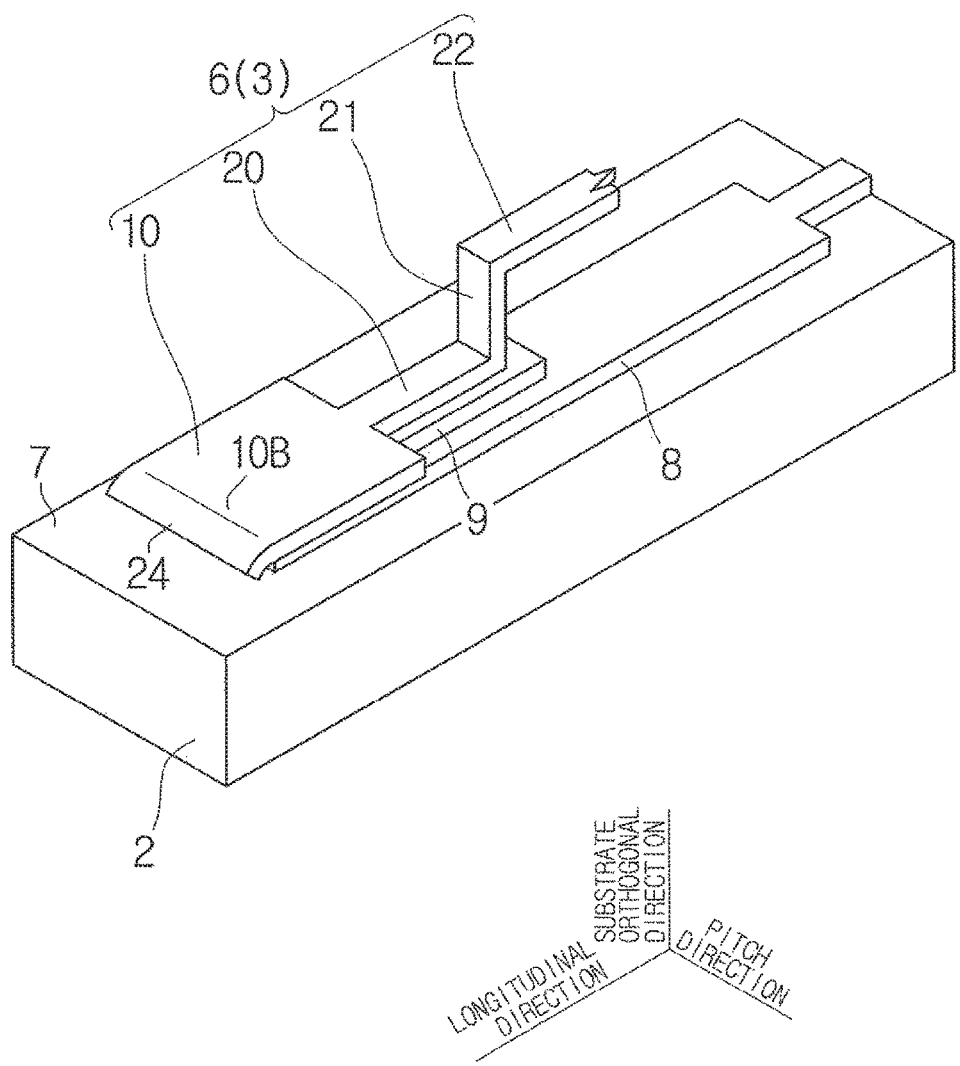
FIG. 16 is a partially perspective view showing a state before the electronic component is mounted on the circuit board (sixth exemplary embodiment)

A sixth exemplary embodiment will be described below with reference to FIG. 16. Differences between the sixth exemplary embodiment and the fourth exemplary embodiment will be mainly described, while a repeat of previous descriptions is omitted.

Each lead 6 further includes a leading end inclined portion 24 (inclined portion) that projects from the leading end 10B of the lower wide portion 10 and is inclined so as to approach the circuit board 2. According to the above structure, scattering of the solder 9 can be more effectively suppressed.

(Seventh Exemplary Embodiment)

Figure 17:
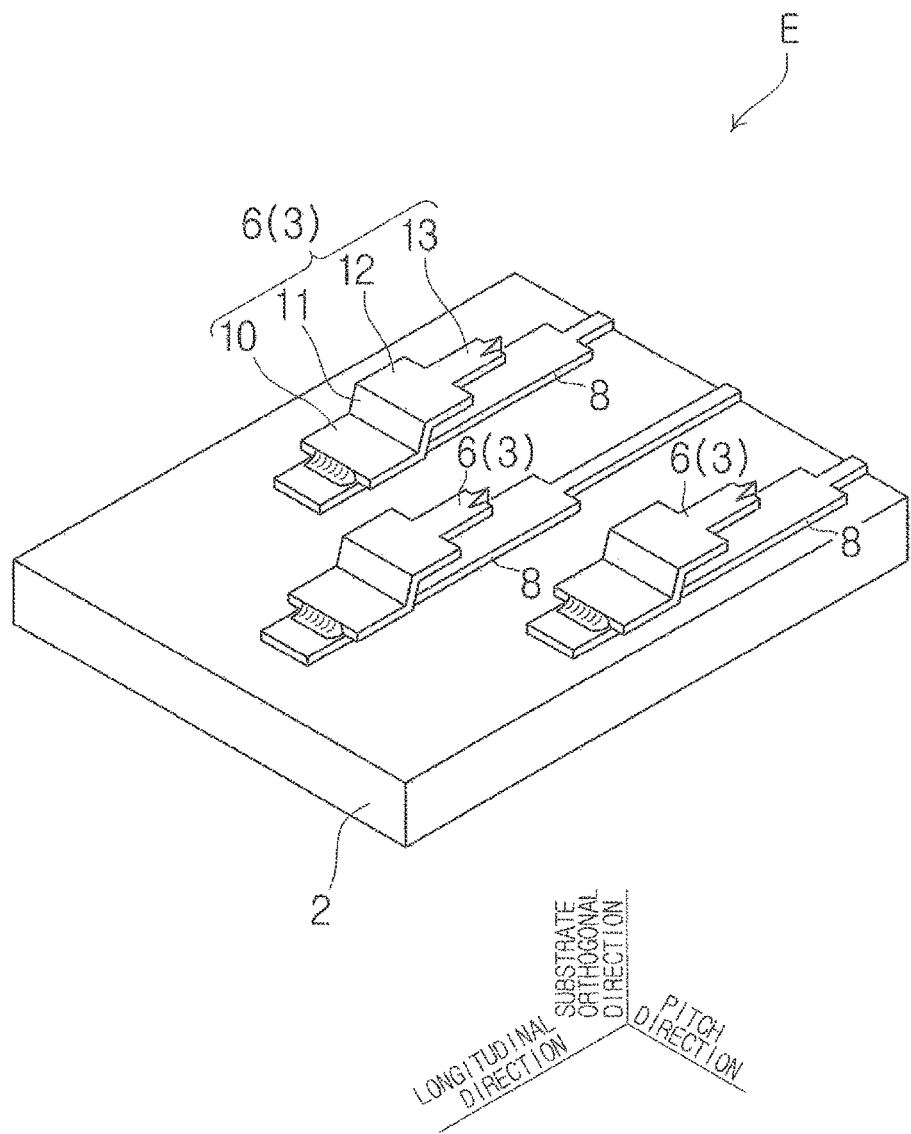
FIG. 17 is a partially perspective view showing a state after the electronic component is mounted on the circuit board (seventh exemplary embodiment)

A seventh exemplary embodiment will be described below with reference to FIG. 17. Differences between the seventh exemplary embodiment and the first exemplary embodiment will be mainly described, while a repeat of previous descriptions is omitted. As shown in FIG. 17, the lower wide portions 10 of the respective leads 6 are preferably arranged in a staggered manner. According to the above structure, the distance between the lower wide portion 10 of one lead 6 and the lower wide portion 10 of another lead 6 can be effectively secured.

(Eighth Exemplary Embodiment)

Figure 18:
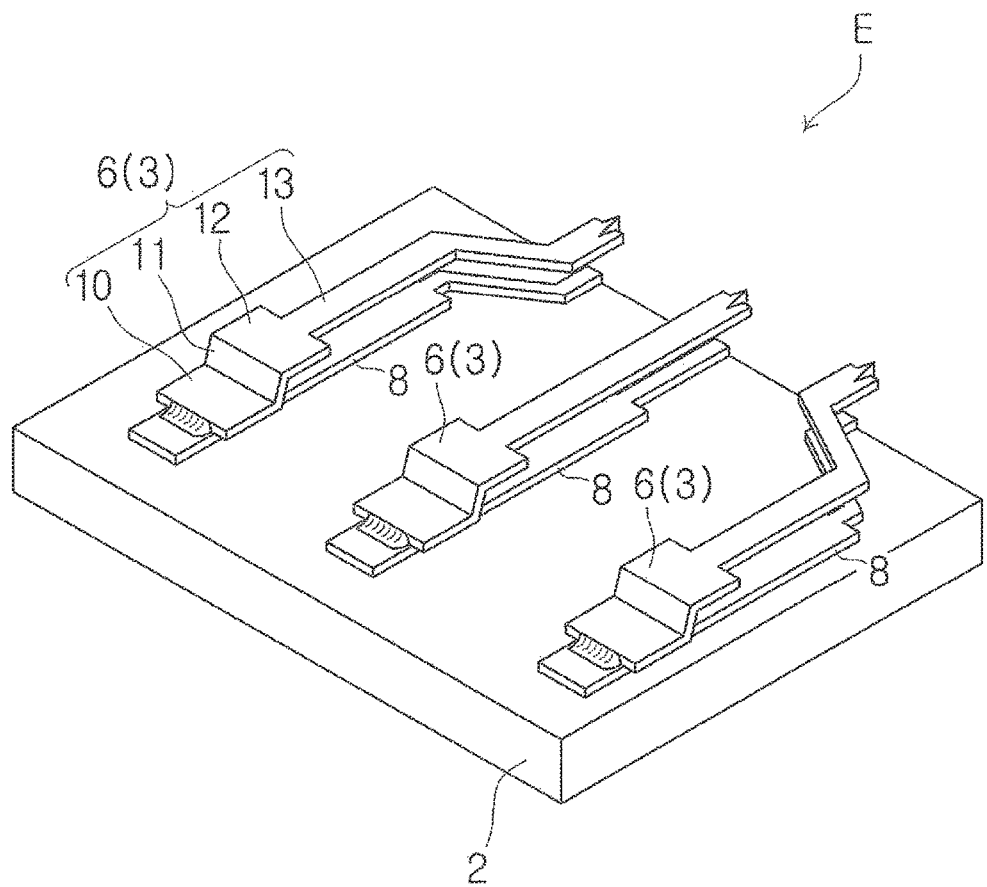
FIG. 18 is a partially perspective view showing a state after the electronic component is mounted on the circuit board (eighth exemplary embodiment)
Figure 19:
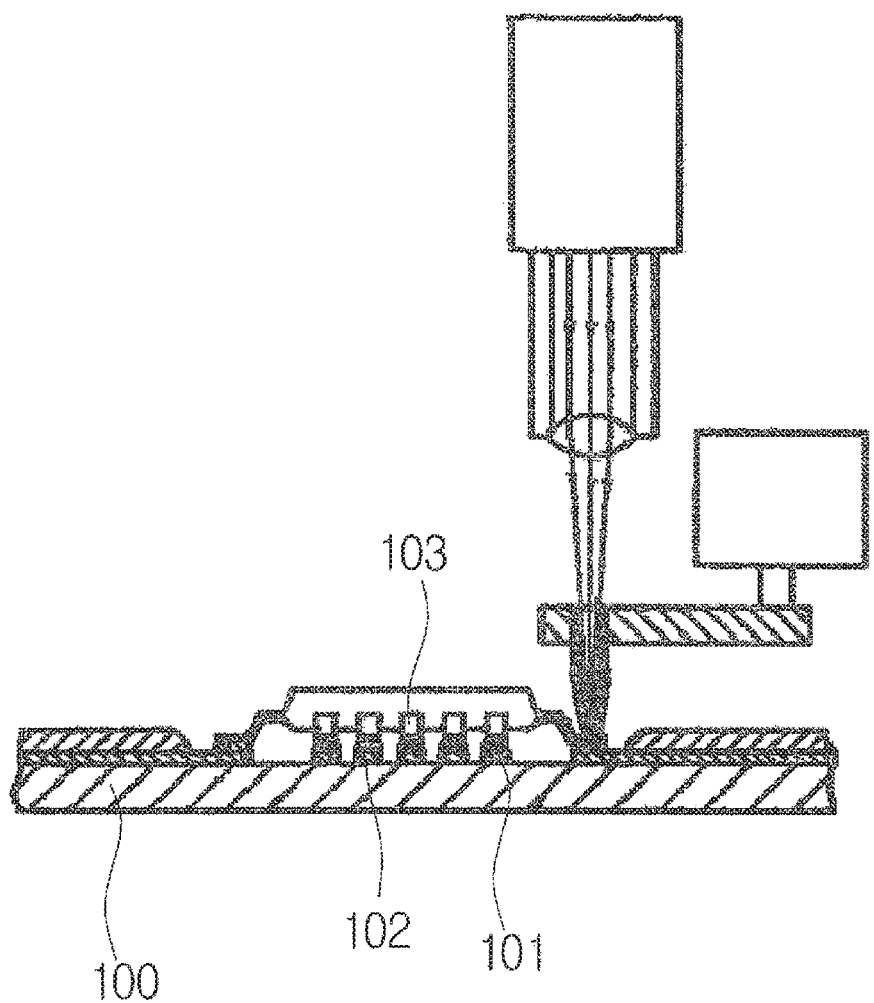
FIG. 19 is a diagram corresponding to FIG. 1 of Japanese Unexamined Patent Application Publication No. H02-213075.

An eighth exemplary embodiment will be described below with reference to FIG. 18. Differences between the eighth exemplary embodiment and the first exemplary embodiment will be mainly described, while a repeat of previous descriptions is omitted. As shown in FIG. 18, it is preferable that the distance between the narrow portions 13 of the leads 6 adjacent to each other in the pitch direction be increased in a direction away from the package 4. According to the above structure, the distance between the lower wide portion 10 of one lead 6 and the lower wide portion 10 of another lead 6 can be effectively secured.

The first to eighth exemplary embodiments of the present invention have been described above.

In the above exemplary embodiments, the lead bonding structure E is applied to mounting of the electronic component 3 on the circuit board 2. Alternatively, the lead bonding structure E can be applied to, for example, mounting of a connector on a circuit board. In this case, the lead bonding structure E includes a plurality of leads extending outward from a housing (lead supporter), and a plurality of electrode pads that are formed on a circuit board (board). The plurality of leads are soldered to the plurality of electrode pads, respectively. Each lead includes a wide portion having a width dimension greater than the width dimension of each electrode pad, and the wide portion of each lead is soldered to the corresponding electrode pad. The connector includes a housing and a plurality of leads held in the housing.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A lead bonding structure comprising:
a plurality of leads extending outward from a lead supporter; and
a plurality of electrode pads formed on a board, the plurality of leads being respectively soldered to the plurality of electrode pads, wherein
each of the leads includes a wide portion having a width dimension greater than a width dimension of each of the electrode pads, the width dimension of each of the leads being a dimension in a pitch direction in which the plurality of leads are arranged, the width dimension of each of the electrode pads being a dimension in the pitch direction,
the wide portion of each of the leads is soldered to the corresponding electrode pad
each of the leads further includes:
a separating projecting portion that projects from a rear end of the wide portion in a direction away from the board; and
a narrow portion that extends toward the lead supporter from an upper end of the separating projecting portion and has a width dimension smaller than the width dimension of each of the electrode pads.

2. The lead bonding structure according to claim 1, wherein a leading end of the wide portion of each of the leads is farther from the lead supporter than a leading end of the corresponding electrode pad, the leading end of the corresponding electrode pad being an end farther from the lead supporter.

3. The lead bonding structure according to claim 1, wherein each of the leads further comprises an inclined portion that projects from the wide portion and is inclined so as to approach the board.

4. The lead bonding structure according to claim 1, wherein each of the leads further comprises a side edge inclined portion that projects from a side edge of the wide portion and is inclined so as to approach the board.

5. The lead bonding structure according to claim 1, wherein each of the leads further comprises two side edge inclined portions that project from both side edges of the wide portion, respectively, and are inclined so as to approach the board.

6. The lead bonding structure according to claim 1, wherein each of the leads further comprises a leading end inclined portion that projects from a leading end of the wide portion and is inclined so as to approach the board.

7. The lead bonding structure according to claim 1, wherein the wide portion of each of the leads is soldered to the corresponding electrode pad under a condition where the wide portion covers the entire pitch-direction area of the corresponding electrode pad.

* * * * *